United States Patent
Fujii

(10) Patent No.: US 6,781,305 B1
(45) Date of Patent: Aug. 24, 2004

(54) ORGANIC ELECTROLUMINESCENT DEVICE HAVING NEGATIVE ELECTRODE CONTAINING A SELECTIVE COMBINATION OF ELEMENTS

(75) Inventor: Hiroyuki Fujii, Moriguchi (JP)

(73) Assignee: Sanyo Electric Co., Ltd., Moriguchi (JP)

(*) Notice: Subject to any disclaimer, the term of this patent is extended or adjusted under 35 U.S.C. 154(b) by 0 days.

(21) Appl. No.: 09/470,057

(22) Filed: Dec. 22, 1999

(30) Foreign Application Priority Data

Dec. 25, 1998 (JP) .............................. 10-370799

(51) Int. Cl.⁷ ........................... H05B 33/00; H05B 33/26
(52) U.S. Cl. ........................ 313/504; 313/503; 313/506; 428/690
(58) Field of Search ................................. 313/503, 504, 313/507, 498, 311, 310; 428/690, 917

(56) References Cited

U.S. PATENT DOCUMENTS

| | | | |
|---|---|---|---|
| 4,769,292 A | * 9/1988 | Tang et al. .................. | 313/504 |
| 4,885,211 A | 12/1989 | Tang et al. | |
| 5,047,687 A | 9/1991 | VanSlyke | |
| 5,059,861 A | 10/1991 | Littman et al. | |
| 5,429,884 A | 7/1995 | Namiki et al. | |
| 5,500,568 A | * 3/1996 | Nakamura et al. .......... | 313/504 |
| 5,731,661 A | 3/1998 | So et al. | |
| 5,739,635 A | 4/1998 | Wakimoto | |
| 5,747,930 A | 5/1998 | Utsugi | |
| 5,776,623 A | * 7/1998 | Hung et al. .................. | 313/504 |
| 5,896,006 A | 4/1999 | Kusaka et al. | |
| 5,936,257 A | * 8/1999 | Kusunoki et al. ............ | 313/311 |
| 5,952,779 A | * 9/1999 | Arai et al. ................... | 313/504 |
| 6,163,110 A | * 12/2000 | Arai ............................ | 313/504 |
| 6,259,204 B1 | * 7/2001 | Ebisawa et al. ............. | 313/504 |
| 6,284,393 B1 | * 9/2001 | Hosokawa et al. .......... | 313/504 |

FOREIGN PATENT DOCUMENTS

| | | | | |
|---|---|---|---|---|
| JP | 2-15595 | 1/1990 | | |
| JP | 08-209120 | 8/1996 | | |
| JP | 09097676 A | * 4/1997 | ........... | H05B/33/14 |
| JP | 09-232079 | 9/1997 | | |
| JP | 10-012381 | 1/1998 | | |

* cited by examiner

Primary Examiner—Ashok Patel
Assistant Examiner—Mariceli Santiago
(74) Attorney, Agent, or Firm—W. F. Fasse; W. G. Fasse

(57) ABSTRACT

Organic electroluminescent devices having a luminescent material-containing layer interposed between a positive electrode and a negative electrode and designed to supply an electrical energy to the luminescent material that emits light upon receipt of the energy. The negative electrode contains f and p elements. The f is at least one element selected from those having electronegativity values higher than that of calcium, and, equal to or lower than that of vanadium. The p is at least one element selected from those having electronegativity values equal to or higher than that of aluminum. The negative electrode may further contain d element, if necessary. The d is at least one element selected from those having electronegativity values equal to or higher than any of those of iron, cobalt and nickel, and, equal to or lower than that of gold.

19 Claims, 2 Drawing Sheets

ORGANIC ELECTROLUMINESCENT DEVICE HAVING NEGATIVE ELECTRODE CONTAINING A SELECTIVE COMBINATION OF ELEMENTS

BACKGROUND OF THE INVENTION

1. Field of the Invention

The present invention relates to an organic electroluminescent device utilizing an electroluminescent phenomenon produced in organic substances, more particularly to a device which is configured to interpose an organic luminescent medium-containing layer between a positive electrode and a negative electrode and designed to emit light when an electric field is applied thereto.

2. Description of Related Art

An organic electroluminescent (may be hereinafter referred to as EL) is formed of a thin film containing an organic fluorescent material interposed between positive and negative electrodes, and is such designed that a hole and an electron are injected into the thin film where they recombine to create an electron excited state, such as an exiton. As this excited state is deactivated, light emission occurs (by fluorescence, phosphorescence, delayed fluorescence, luminescent phenomena accompanying transport of energy, or the like). The organic EL device emits light utilizing this mechanism.

Characteristically, the organic EL device is capable of planar light emission with a high level of luminance ranging from 100 to 10,000 cd/m$^2$ when the applied voltage is about 10 volts. Also, different emission hues, from blue to red, can be obtained by selecting the type of the organic fluorescent material used in the organic EL device.

The improvement in emission efficiency of the organic EL device can be achieved by increasing the efficiency of electron injection, and the use of low work function metals or their alloys for negative electrode materials have been attempted to increase the electron injection efficiency. In U.S. Pat. No. 4,885,211 and Japanese Patent Laying-Open No. Hei 2-15595, for example, a negative electrode material is disclosed which contains at least 50 atomic % of Mg and at least 0.1 atomic % of metal having a work function of at least 4.0 eV. Japanese Patent Laying-Open No. Hei 8-209120 discloses the use for a negative electrode of an alloy formed of 0.005–10% by mass of an alkaline metal and a second metal. Japanese Patent Laying-Open No. Hei 9-232079 discloses a negative electrode material formed of an alloy which contains, by a total amount, 0.5–5 atomic % of an alkaline metal or an alkaline earth metal having a work function of up to 2.9 eV. Japanese Patent Laying-Open No. Hei 10-12381 discloses the use of a ternary alloy for a negative electrode material, which contains 1–30 atomic % of a metal having a work function of at least 4.0 eV, 0.002–2.0 atomic % of Li, and the balance of Mg.

However, the conventional techniques such as described in the above-cited references use negative electrode materials containing extremely lower work function metals, i.e., metals having higher tendencies to release electrons. When exposed to moisture or oxygen present in the air, such materials readily undergo oxidation to result in the accelerated deterioration of the negative electrodes. This has led to such problems as luminance reduction, build-up of operating voltage, formation and expansion of nonradiative regions called "dark spots".

SUMMARY OF THE INVENTION

An object of the present invention is to provide an organic electroluminescent device which, due to its utilization of a specific negative electrode material, can exhibit high levels of emission efficiency and emissive luminance and suppress a luminance drop during a long-term operation.

In accordance with a first aspect of the present invention, an organic electroluminescent device has a luminescent material-containing layer interposed between a positive electrode and a negative electrode, and is designed to supply an electrical energy to the luminescent material that emits light upon receipt of the energy. The negative electrode characteristically contains at least one element, "f", selected from elements having electronegativity values greater than that of calcium (Fauling electronegativity value=1.0) and equal to or less than that of vanadium (Pauling electronegativity value=1.6), and at least one element, "p", selected from elements having electronegativity values equal to or greater than that of aluminum (Pauling electronegativity value=1.5).

Examples of useful "f" elements include Be (1.5), Ti (1.5), V (1.6), Cr (1.6), Mn (1.5), Zr (1.4), Nb (1.6), La (1.1), C (1.1–1.2), Pr (1.1–1.2), Nd (1.1–1.2), Sm (1.1–1,2), Gd (1.1–1.2), Tb (1.1–1.2), Dy (1.1–1.2), Ho (1.1–1.2), Er (1.1–1.2), Tm (1.1–1.2), Lu (1.1–1.3), Hf (1.3) and Ta (1.5), wherein numerical values given in parentheses represent publicly available Pauling electronegativity values.

Examples of useful "p" elements include H (2.1), B (2.0), C (2.5), N (3.0), O (3.5), F (4.0), Al (1.5), Si (1.8), P (2.1), S (2.5), Cl (3.0), Ga (1.6), Ge (1.8), As (2.0), Se (2.4), Br (2.8), In (1.7), Sb (1.9), Te (2.1), I (2.5), Ti (1.8), Zn (1.6), Cd (1.7) and Hg (1.9), wherein numerical values given in parentheses represent publicly available Pauling electronegativity values.

In accordance with a second aspect of the present invention, an organic electroluminescent device has a luminescent material-containing layer interposed between a positive electrode and a negative electrode, and is designed to supply an electrical energy to the luminescent material that emits light upon receipt of the energy. The negative electrode characteristically contains at least one element, "f", selected from elements having electronegativity values greater than that of calcium (Pauling electronegativity value=1.0) and equal to or less than that of vanadium (Pauling electronegativity value=1.6), at least one element, "p", selected from elements having electronegativity values equal to or greater than that of aluminum (Pauling electronegativity value=1.5), and at least one element, "d", selected from elements having electronegativity values equal to or greater than any of those of iron (Pauling electronegativity value=1.6), cobalt (Pauling electronegativity value=1.6) and nickel (Pauling electronegativity value= 1.6) and equal to or less than that of gold (Pauling electronegativity value=2.4), wherein the "d" element selected is the element that is excluded from the selection of the "f" or "p" element.

Examples of useful "d" elements include Re (1.9), Fe (1.8), Ru (2.2), Os (2.2), Co (1.8), Rh (2.2>, Ir (2.2), Ni (1.8), Pd (2.2), Pt (2.2), Cu (1.9), Au (2.4), Hg (1.9), Tl (1.8), Si (1.8), Ge (1.8), P (2.1), As (2.0), Sb (1.9), Se (2.4) and Te (2.1), wherein numerical values given in parentheses indicate publicly available Pauling electronegativity values.

In a third aspect of the present invention, the element, "p", as used in the aforementioned first and second aspects, is selected from elements having electronegativity values equal to or greater than that of aluminum (Pauling electronegativity value=1.5), less than that of carbon (Pauling electronegativity value=2.5), and less than that of iodine (Pauling electronegativity value=2.5).

It is preferably that those elements, "f", "p" and "d", are selected from different groups in the periodic table, respectively. A preferred element content of the negative electrode material is in the range of 0.1–10% by mass (more preferably in the range of 0.3–3% by mass) for the "f" element, in the range of 0.1–99.5% by mass for the "p" element, and in the range of 0–99.8% by mass for the "d" element. When the three elements, "f", "p" and "d", are all contained in the negative electrode material, it is preferred that a sum of the "p" and "d" element contents is not below 90% by mass.

In a fourth aspect of the present invention, the luminescent material-containing layer, as used in the first through third aspects, contains at least a host as a principal constituent and a fluorescent dopant. A ratio in molar mass of the dopant molecule to the host molecule (dopant/host) is generally in the range of 0.344–2.90, preferably in the range of 0.441–2.26.

In a fifth aspect of the present invention, the "f" is at least one element selected from elements which have electronegativity values greater than that of calcium (Pauling electronegativity value=1.0), and, less than that of zirconium (Pauling electronegativity value=1.4) and which, in the form of simple substance, have melting points higher than that of lithium (literature-listed melting point =180.5° C.), and, equal to or lower than that of lutetium (literature-listed melting point=1,660° C.). Specifically, the "f" is at least one element selected from Sc (1,540° C.), Y (1,520° C.), La (921° C.), Ce (799° C.), Pr (931° C.), Nd (1,020° C.), Sm (1,080° C.), Eu (822° C.), Gd (1,310° C.), Tb (1,360° C.), Dy (1,410° C.), Ho (1,470° C.), Er (1,530° C.), Tm (1,550° C.), Yb (819° C.) and Lu (1,660° C.), wherein numerical values given in parentheses represent melting points of their simple substances as listed in a literature.

In a sixth aspect of the present invention, the "f" is the element whose simple substance has a melting point of lower than that of Sc (1,540° C.). Specifically, the "f" is at least one element selected from Y, La, Ce, Pr, Nd, Sm, Eu, Gd, Tb, Dy, Ho, Er and Yb. These "f" elements are particularly suitable when negative electrodes are formed by a resistance-heat or electron-beam vapor deposition technique.

In a seventh aspect of the present invention, the "f" is the element whose simple substance has a melting point of below 1,000° C. Specifically, the aft is at least one element selected from La, Ce, Pr, Eu and Yb. These "f" elements are particularly suitable when negative electrodes are formed by a resistance-heat vapor deposition technique.

In an eighth aspect of the present invention, the "f" is the element whose simple substance has a boiling point equal to or lower than that of Ce or Lu, and, equal to or higher than that of Dy. Specifically, the "f" is at least one element selected from Sc (2,830° C.), Y (3,300° C.), Ce (3,400° C.), Pr (3,000° C.), Nd (3,100° C.), Gd (3,300° C.), Tb (3,100° C.), Dy (2,560° C.), Ho (2,690° C), Er (2,860° C) and Lu (3,400° C), wherein numerical values given in parentheses represent boiling points of their simple substances as listed in a literature. The "f" element is selected preferably from lanthanum series elements, more preferably from cerium group elements with atomic numbers 57 through 62 (La~Sm). These "f" elements are suitable when negative electrodes are formed by a resistance-heat vapor deposition technique, and are particularly suitable when negative electrodes are sputter formed.

In a ninth aspect of the present invention, the "f" is the element whose simple substance has a boiling point equal to or lower than that of Tm. Specifically, the "f" is at least one element selected from Sm (1,790° C.), Eu (1,600° C.), Tm (1,950° C.) and Yb (1,194° C.), wherein numerical values given in parentheses represent melting points of their simple substances as listed in a literature. Preferably, the "f" is the element whose simple substance has a boiling point equal to or higher than that of Eu. These "f" elements are suitable when negative electrodes are formed by a resistance heat vapor deposition technique, and are particularly suitable when negative electrodes are formed by an electron-beam vapor deposition technique.

In a tenth aspect of the present invention, the "f" is the element whose simple substance has a metallic bond radius equal to or smaller than that of cerium, and, equal to or larger than that of thulium or lutetium. Specifically, the "f" is at least one element selected from Ce (0.183 nm), Pr (0.182 nm), Nd (0.181 nm), Sm (0.179 nm), Gd (0.179 nm), Tb (0.176 nm), Dy (0.175 nm), Ho (0.174 nm), Er (0.173 nm), Tm (0.172 nm) and Lu (0.172 nm), wherein numerical values given in parentheses indicate metallic bond radii,of their simple substances as listed in a literature.

In an eleventh aspect of the present invention, the "p" is at least one element selected from Zn, B, Al, In, Tl, Si, Ge, Sn, P, Sb, Bi, S, Se and Te.

In a twelfth aspect of the present invention, the "d" is the transition metal element whose simple substance has a melting point lower than that of Mo (2,620° C.). Specifically, the "d" is at least one element selected from Fe (1,540° C.), Ru (2,310° C.), Co (1,490° C.), Rh (1,970° C.), Ir (2,410° C.), Ni (1,450° C.), Pd (1,550° C.), Pt (1,770° C.), Cu (1,083° C.), Ag (962° C.) and Au (1,064° C.), wherein numerical values given in parentheses indicate melting points of their respective simple substances as listed in a literature, In a thirteenth aspect of the present invention, the "p" element is Al, while the "d" is the element whose simple substance has a boiling point equal to or lower than that of Co, and, equal to or higher than that of Ag. Specifically, the "d" is at least one element selected from Co (2,870° C.), Ni (2,730° C.), Cu (2,570° C.) and Ag (2,210° C.), wherein numerical values given in parentheses indicate boiling points of their respective simple substances as listed in a literature.

Al, if used as the "p" element, melts and vaporizes at temperatures respectively lower than the melting point (660.4° C.) and boiling point (2,470° C.) of its simple substance. This effectively facilitates formation of negative electrodes by a vacuum vapor deposition technique. Also, Al, if existing in the form of a simple substance, has the following physical properties; electrical resistivity=2.655 $\mu\Omega$cm, thermal conductivity=237 W/m·K, Young's modulus=68.3 GN/m$^2$ and coefficient of linear expansion= 0.237×10$^{-4}$/K. Accordingly, the Al-containing negative electrodes exhibit excellent electrical and thermal conductivities, as well as appropriate levels of mechanical strength.

In a fourteenth aspect of the present invention, the "p" element is Sb, while the "d" is the element whose simple substance has a thermal conductivity equal to or higher than that of Al. Specifically, the "d" is at least one element selected from Ag (427 W/m·K), Cu (398 W/m·K), Au (315 W/m·K) and Al (237 W/m·K), wherein numerical values given in parentheses indicate thermal conductivities of their respective simple substances as listed in a literature.

Sb, if used as the "p" element, melts and vaporizes at temperatures respectively lower than the melting point (630.7° C.) and boiling point (1,750° C.) of its simple substance. This effectively facilitates formation of negative electrodes by a vacuum vapor deposition technique. Also, Sb, if existing in the form of simple substance, has the following physical properties; Young's modulus=77.9 $GN/m^2$ and coefficient of linear expansion=$0.172\times10^{-4}$/K (parallel to a c-axis) and $0.080\times10^{-4}$/K (perpendicular to a c-axis). By the same reason as applied to Al, the Sb-containing negative electrodes exhibit appropriate levels of mechanical strength. Sb, if in the form of simple substance, also has the following physical properties; electrical resistivity=39.6 $\mu\Omega$cm and thermal conductivity=24.3 W/m·K. Accordingly, when desired to obtain negative electrodes having excellent electrical conductivities and excellent heat dissipating properties through heat conduction, Sb, as the "p" element, may preferably be used in combination with the other element whose simple substance has the reduced electrical resistivity and the increased thermal conductivity. Examples of such elements for use in combination with Sb are below listed with their respective physical properties measured when in the form of simple substance; Ag (electrical resistivity 1.59 $\mu\Omega$cm, Young's modulus=76 $GN/m^2$ and coefficient of linear expansion=$0.193\times10^{-4}$/K), Cu (electrical resistivity=1.67 $\mu\Omega$cm (20° C.), Young's modulus=110 $GN/m^2$ and coefficient of linear expansion=$0.162\times10^{-4}$/K) and Au (electrical resistivity 2.35 $\mu\Omega$cm, Young's modulus=80 $GN/m^2$ and coefficient of linear expansion=$0.142\times10^{-4}$/K).

In a fifteenth aspect of the present invention, the "p" element is Bi, while the "d" is the metallic element whose simple substance has a thermal conductivity equal to or higher than that of Au. Specifically, the "d" is at least one element selected from Ag, Cu and Au.

Bi, if used as the "p" element, melts and vaporizes at temperatures respectively lower than the melting point (271.3° C.) and boiling point (1,560° C.) of its simple substance. This effectively facilitates formation of negative electrodes by a vacuum vapor deposition technique. Also, Bi, if existing in the form of simple substance, has the following physical properties; Young's modulus=31.7 $GN/m^2$, coefficient of linear expansion=$0.162\times10^{-4}$/K (parallel to a c-axis) and $0.120\times10^{-4}$/K (perpendicular to a c-axis). By the same reason as applied to Al and Sb, the Bi-containing negative electrodes exhibit appropriate levels of mechanical strength. Bi, if in the form of simple substance, also has the following physical properties; electrical resistivity=107 $\mu\Omega$cm and thermal conductivity =9.15 W/m·K (perpendicular to a c-axis). Accordingly, when desired to obtain negative electrodes having excellent electrical conductivities and excellent heat dissipating properties via heat conduction, Bi, as the "p" element, may preferably be used in combination with the other element whose simple substance has the reduced electrical resistivity and the increased thermal conductivity compared to the "p" element.

In a sixteenth aspect of the present invention, a mean electronegativity value $E_{ave}$, as calculated from weighting an electronegativity value of each element constituting a negative electrode by a proportion in number of its atoms present in the negative electrode, is in the range of 1.50–1.91, assuming that an electronegativity value of a lanthanoid element (Ln), such as Ce, is 1.15. The mean electronegativity value $E_{ave}$ is preferably in the range of 1.50–1.59 or 1.80–1.91.

In a seventeenth aspect of the present invention, when a flow of an DC current drives the device to emit light with a controlled luminance of 100 $cd/m^2$, an emission efficiency, as calculated by dividing the luminance by a current density, is not below 10.0 cd/A.

In accordance with a eighteenth aspect of the present invention, an organic electroluminescent device has a luminescent material-containing layer interposed between a positive electrode and a negative electrode, and is designed to supply an electrical energy to the luminescent material that emits light upon receipt of the energy. The negative electrode contains "f" and "p" elements. The "f" is the element whose simple substance has a metallic bond radius equal to or larger than that of Ce, and, equal to or smaller than that of Eu or Yb. Specifically, the Aft is at least one element selected from La (0.187 nm), Ce (0.183 nm), Eu (0.198 nm) and Yb (0.194 nm), wherein numerical values given in parentheses indicate metallic bond radii of their simple substances as listed in a literature. The "p" is the element hose simple substance has a melting point equal to or lower than that of Al (melting point=660.4° C.), and, equal to or higher than that of Sn (melting point=231.97° C.), as well as having a modulus of elasticity intension, i.e., Young's modulus equal to or higher than that of Sn, and, equal to or lower than that of Zn. Specifically, the "p" is at least one element selected from Zn (96.5 $GN/m^2$), Al (68.3 $GN/m^2$), Sn (41.4 $GN/m^2$) and Sb (77.9 $GN/m^2$), wherein numerical values given in parentheses indicate Young's moduli of their simple substances as listed in a literature.

In an nineteenth aspect of the present invention, the "f" and "p" elements, as used in the aforementioned 18th aspect, are Ce and Al, respectively.

In accordance with a twentieth aspect of the present invention, the negative electrode, as used in the preceding 1st, 3rd through 11th and 16th through 19th aspects, includes a first layer closest to the luminescent material-containing layer, a second layer overlying the first layer and a third layer overlying the second layer. The first negative electrode layer is substantially formed from the "f" element, the second negative electrode layer from a mixture or compound of the "f" and "p" elements, and the third negative electrode layer from the "p" element.

In accordance with the twenty-first aspect of the present invention, the second negative electrode layer, as used in the aforementioned 20th aspect, has a composition gradient in its thickness direction such that toward its interface with the third negative electrode layer from its interface with the first negative electrode layer, its "f" element content decreases while its "p" element content increases.

Such a composition graded structure of the second negative electrode layer not only contributes to the improved interlaminar adhesion between the first and second negative electrode layers and between the second and third negative electrode layers, but also serves to relax a thermal shock due to a difference in thermal expansivity between the first and third negative electrode layers.

In accordance with the twenty-second aspect of the present invention, at least one of the first, second and third negative electrode layers, as respectively used in the 20th aspect of the present invention, contains an additional element different from the constituent element thereof.

A high level of emission efficiency is realized by the organic EL device according to the present invention. For example, when the organic EL device is driven by a flow of an DC current to emit light with a luminance of 100 $cd/m^2$, it can exhibit an emission efficiency of not below 7.0 cd/A, further of not below 10.0 cd/A, as calculated by dividing the luminance by a current density. Furthermore, the organic EL device can be obtained which exhibits an emission efficiency of not below 5.0 lm/w, further of not below 10.0 lm/w, as calculated by dividing a luminous flux emitted therefrom by an input power applied thereto.

A high level of luminance is also realized by the organic EL device according to the present invention. For example, the organic EL device can be obtained which exhibits an emissive luminance $L_{5V}$ of not below 250 cd/m², further of not below 500 cd/m²₁ when the applied voltage is 5 volts.

Also in accordance with the present invention, a luminance drop during a long-term operation can be suppressed. For example, the organic EL device can be obtained which, when its operation by an DC constant current is started from an initial luminance of 500 cd/m² and continued until a current density converges to a constant value, exhibits a luminance ratio $R_{500h}$, as calculated by a ratio of the initial luminance to a luminance after the lapse of 500 hours, of not below 10%, further of not below 50%.

A definition of electronegativity was proposed by Pauling and alternatively by Mulliken, and have been modified to date by their successors. The electronegativity values according to the Pauling scale is used throughout the specification of this application. However, this is not intended to exclude the use of other scales, such as the Mulliken electronegativity scale, as a selection reference of elements for use in the practice of the present invention, since they are approximately in line with each other. The electronegativity is a parameter as a measure of the power of a bonding atom to attract electrons to itself. The greater the difference in electronegativity between two atoms that form a bond, the more likely one atom attracts electrons to itself. This results in an increased ionic character in the bond. The electronegativity can also be used as a measure of indicating an electro-donating or electron-accepting property of an atom. The less electronegative atom has a greater electro-donating property, while the more electronegative atom has a stronger electro-accepting property. The atom having an intermediate electronegativity has an amphoteric property. Electronegativity values for various elements are scaled by Pauling or Mulliken. Although closely related to physical properties of elements, the electronegativity is not a physicochemical quantity such as mass or voltage, and thus carries no unit.

If the Mulliken approach is applied, the value of electronegativity (EN) of a given element can be determined from its ionization energy (IE) and electron affinity (EA) by using the following experimental equation;

$$EN=(IE+EA)/(544 \text{ kJ·mol}^{-1})$$

Also, if the Pauling approach is applied, the difference $\delta E_{AB}$ in electronegativity between the two elements A and B in a compound AB can be obtained from the following equation;

$$\delta E_{AB}=0.088[\{E_{real}-(E_{AA} \cdot E_{BB})^{0.5}\}/(\text{kJ·mol}^{-1})]^{0.5}$$

where $E_{real}$ is a measured value for a bond energy of a A-B bond formed between the two elements A and B, and $E_{AA}$ and $E_{BB}$ are measured values for bond enegies of A—A and B—B bonds, respectively.

For the compound AB, if the difference $\delta E_{AB}$ in electronegativity between the elements A and B is zero, the A-B bond has a 100% pure covalent character. If an absolute value of $\delta E_{AB}$ is about 1.7, the A-B bond has 50% ionic and 50% covalent characters. If an absolute value of $\delta E_{AB}$ is 2.0, the A-B bond has about 63% ionic and about 37% covalent characters, showing a marked ionic character. The followings illustrate proportions of ionic bonding property that indicate bonding properties of vaious hologen halide molecules, as estimated from measurements of dipole moments that exist in those molecules, and an absolute value of electronegativity difference $\delta E_{HX}$ between hydrogen (H) and a halogen element (X) together constituting each of those hydrogen halide molecules; hydrogen iodide (ioninc bonding property=4%, $\delta E_{HI}=0.4$), hydrogen bromide (ioninc bonding property=11%, $\delta E_{HBr}=0.7$) and hydrogen chloride (ioninc bonding property=19%, $\delta E_{HCl}=0.9$).

In the manner as stated above, the electronegativity can be used as an important indication when determining bonding states between similar or dissimilar elements.

The concept of electronegativity is intrinsic to an element. For example, diamond, graphite and amorphous carbon are allotropic forms of carbon. They have the same electronegativity value, regardless of their allotropic forms. It is however pointed out that they have work functions significantly different from each other.

Work function is an indicator as frequently used heretofore when selecting elements for constituting a negative electrode of an organic EL device. This work function is a physicochemical quantity that varies sensively depending upon the surface conditions of materials, and can be an useful indicator if a collection of measured values for individual materials is obtained. However, the use of work function, as determined for each single element, as an indicator for property prediction, such as of compounds or mixtures consisting of plural elements, gives results that are not considered to be very good. In the present invention, the electronegativity, a characteristic value intrinsic to an element, is used as a representative indicator when selecting elements for constituting a negative electrode. The electronegativity is a numerical representation of the power of an element atom to hold electrons using an integer or real number, and the present invention utilizes electronegativity values which indicate element-intrinsic preperties, as representative indicators when selecting elements for constituting a negative electrode.

Alkaline or alkaline earth metals have been used to form negative electrodes, for the purpose of improving the efficiency with which electrons are injected into an organic compound layer of an organic EL device. Examples of representing alkaline metals include Cs (0.7), Rb (0.8), K (0.8), Na (0.9) and Li (1.0), and examples of representing alkaline earth metals include Ba (0.9), Sr(1.0), Ca (1.0) and the like, wherein numerical values given in paratheses indicate electronegativity values. All the alakaline metals used, as well as most of the alkaline earth metals used, have electronegativity values of not exceeding 1.0. Since such metals having electronegativity values of not exceeding 1.0 hold electrons very weakly, negative electrodes formed therefrom are readily subjected to oxidation and thus unstable. Also, those metals tend to form water-soluble ionic materials. Accordingly, the exposure thereof to an atmosphere results in the increased occurrence for them to start liquefying from surfaces upon absorption of water vapor or moisture, called a deliquescent phenomenon, which is a problem. For example, Fr, Cs, Rb, K and Na, members of an alakline metal family, are readily oxidized by oxygen in the air to change to their oxides. Li reacts with nitrogen in the air to change to its nitride. Ra, Ba, Sr, Ca and Mg, members of an alkaline earth metal family, are readily oxidized by oxygen in the air to change to their oxides. Fr, Cs, Rb, K, Na, Li, Ba, Sr and Ca also react with a cold water or an atmospheric humid air to produce metal hydroxides and a hydrogen gas.

All the simple salts formed from alakaline metals are soluble in water. $LiNO_3$ and $NaNO_3$ are deliquescent, for example.

In the present invention, a negative electrode at least contains the "f" element selected from those having electronegativity values higher than that of calcium, and, equal to or lower than that of vanadium, instead of the aforementioned element having an electronegativity value of not exceeding 1.0. An atom of the "f" element has an appropriately low electron-holding power, so that efficient injection of electrons can be achieved from a negative electrode region containing the "f" element into an organic compound layer of an organic EL device. Also, the atom constituting the "f" element, if alone, is less subjected to oxidation, compared to those having electronegativity values of not exceeding 1.0. Also, when the "f" element is combined with the "p" element having an electronegativity value of not below 1.5 to form a mixture or compound, oxidation and following deterioration of the negative electrode formed from the mixture or compound can be suppressed to such an extent that its satisfactory performance is maintained. This is explained by the following reason: The atom of the "p" element having an electronegativity value of not below 1.5, preferably in the range of 1.5–2.4, has a higher electron-holding power and the atom itself is relatively less subjected to oxidation. Accordingly, the arrangement of the "p" atoms to surround the "f" atoms protects the "f" atoms from contacting oxidizing species, such as oxygen, nitrogen and moisture.

Where the "f" element having an electronegativity value higher than that of calcium, and, equal to or lower than that of vanadium, together with the "p" element having an electronegativity value equal to or higher than that of aluminium, are included in a negative electrode, a difference $\delta E$ in electronegativity between the "f" and "p" elements does not fall below 0.8, probably resulting in, the formation of the bond having a 15% or higher ionic character between the "f" and "p" atoms. Once such a bond has been formed, it becomes unlikely that the "f" atoms are further oxidized as by oxygen or moisture. It is thus expected that the "f" atoms maintain their predetermined state contemplated in the fabrication of the device. Also, selected combinations of the particular "f" and "p" elements result in preventing the reaction with atmospheric water vapor, i.e., result in the reduced occurrence of a deliquescent phenomenon.

Besides the aforementioned "f" and "p" elements, an additional element, "d", having an electronegativity value equal to or higher than any of those of iron, cobalt and nickel, and, equal to or lower than that of gold may further be included in a negative electrode. The "d" element has an appropriately high electron-holding power, and its atom itself is very unlikely to be oxidized. Accordingly, the arrangement of the "d" atoms to surround the "f" atoms serves to protect the "f" atoms from contacting oxidizing species, such as oxygen, nitrogen and moisture. Also, since the "d" element having an electronegativity value in the range of 1.8–2.4 has a higher tendency to produce a compound or mixture which exhibits a good electric or/and thermal conductivity, a compound or mixture further containing the "d" element, besides the "f" and "p" elements, exhibit improved electrical or/and thermal conductivity.

Where the "f", "p" and "d" elements are respectively selected from different groups in the periodic table, a compound or mixture containing these three different elements possibly forms a material having a more complex structure than when containing the "f", "p" or "d" element alone, and exhibits new physical properties. Such new physical properties include the improved mechanical strength resulting from the change in bonding state of atoms in the material and the increased chemical stability, for example.

As aforestated as the fourth aspect of the present invention, the luminescent material-containing layer may at least contain a host, as a principal constituent, and a fluorescent dopant such that a ratio in molar mass of the dopant molecule to the host molecule (dopant/host) is generally in the range of 0.344–2.90, preferably in the range of 0.441–2.26. When such a composition is vapor deposited, those dopant and host molecules behave similarly in a vapor phase, reach a substrate while forming a nearly perefectly mixed molecular beam in the vapor phase, and change to a solid phase. This enables formation of the luminescent material-containing layer (luminescent layer) from the nearly ideal mixture of the dopant and host molecules. Therefore, the improvement in performance, particularly in emission efficiency, of the organic EL device can be achieved. Its service life can also be extended.

DESCRIPTION OF PREFERRED EMBODIMENTS

A detailed description of the present invention is below given with reference to specific embodiments and examples of the present invention and comparative examples.

EXAMPLE 1

Figure 1:
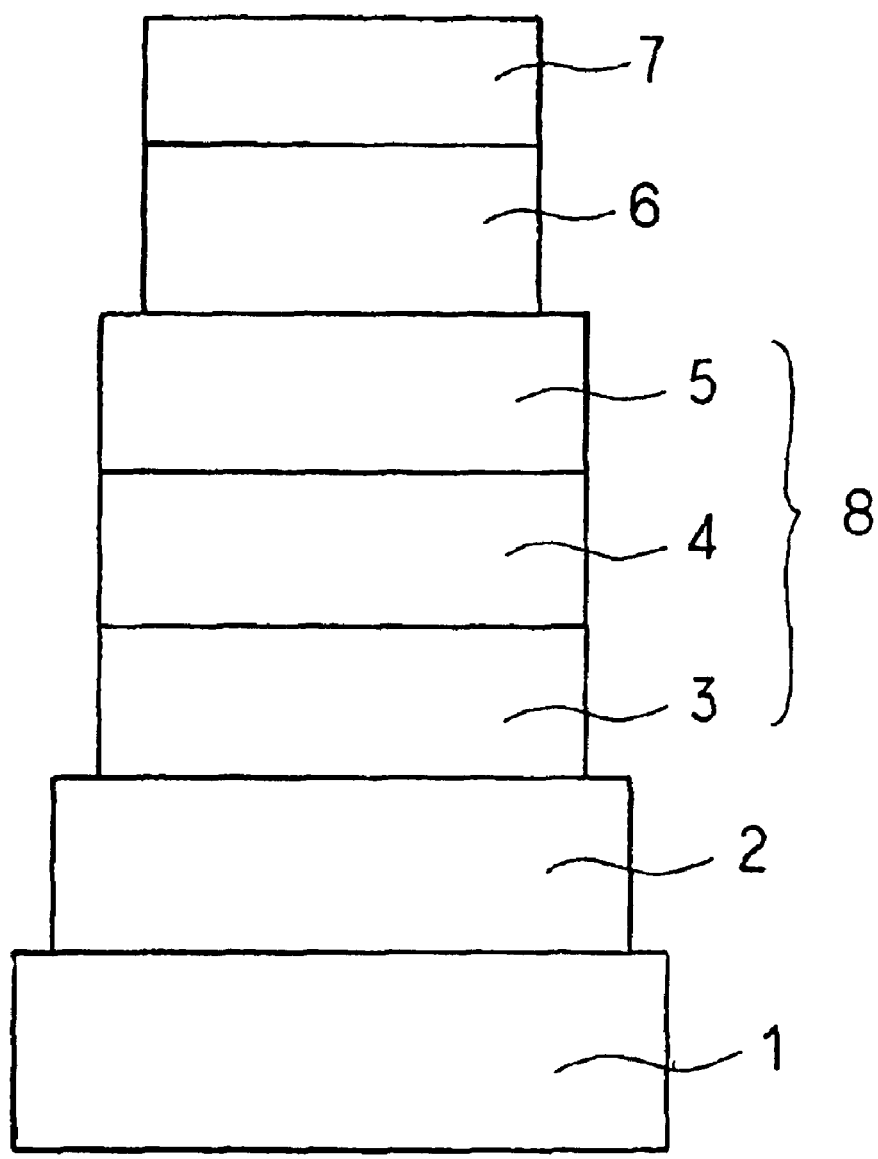
FIG. 1 is a sectional view, illustrating an embodiment of an organic EL device in accordance with the present invention.

FIG. 1 is a sectional view, showing a construction of an organic EL device of Example 1. Referring to FIG. 1, a glass substrate 1 is shown to carry a transparent positive electrode 2 thereon. In the fabrication of a display with light emitting elements arranged in a matrix pattern, a parallel set of strip-form transparent positive electrodes 2 may be pattern formed on the glass substrate 1. A sequence of a hole injecting and transporting layer 3, a luminescent layer 4 and an electron injecting and transporting layer 5, each formed of organic material, overlies the patterned transparent positive electrode 2. The hole injecting and transporting layer 3, luminescent layer 4 and electron injecting and transporting layer 5 constitute an organic EL layer 8. Overlying the electron injecting and transporting layer 5 is a negative electrode 6 covered with a protective film 7.

A manufacturing process of the organic EL device of the present example will be now explained.

Formation of a Tranparent Positive Electrode

A parallel set of stip-form transparent electrodes 2 is pattern formed on the glass substrate 1. An average thickness of the transparent electrodes 2 may be 140 nm, for example. It is generally maintained within the range of 70 nm–3 $\mu$m, preferably within the range of 90 nm–0.5 $\mu$m. Conductive materials generally used to form the transparent positive electrode 2 generally have work functions (WF) or ionization potentials (IP) from a solid state of about 4.6 eV or higher, and exmaples thereof include chalcogenide compounds such as indium tin oxide (ITO) and tin oxide ($SnO_2$), simple substances and compounds of metallic elements such as Co, Au, Ni, Pd and Pt. In this Example, the transparent positive electrode 2 was formed from indium tin oxide (ITO). Its ionization potential (IP) from a solid state was 4.7 eV, when measured under an atmospheric pressure according to a low energy electron counting method. Patterning of the transparent electrode 2 can be achieved by known techniques, such as a wet etching technique using an aqueous solution of hydrochloric acid containing $FeCl_3$.

For the purpose of removing any impurities that may be present thereon, as by oxidation or decomposition, the patterned positive electrode 2 is UV etched under the oxygen-containing atmosphere until its clean surface is exposed to outside. Since this cleaning process is a dry process which does not use a solution, it is very unlikely that the patterned positive electrode 2 is at its surface recontaminated by impurities.

Formation of an Organic EL Layer

The hole injecting and transporting layer 3, luminescent layer 4 and electron injecting and transporting layer 5 are sequentially stacked on the glass substrate 1 carrying the transparent positive electrode 2 by a vacuum vapor deposition technique. The hole injecting and transporting layer 3, luminescent layer 4 and electron injecting and transporting layer 5 are vapor deposited at a surrounding pressure reduced to about 0.1 mPa at a substrate temperature of 25° C. The hole injecting and transporting layer 3 was formed from 4, 4', 4"-tris (3-methylphenylphenylamino) triphenylamine (generally called MTDATA), which is a derivative of aromatic amine and represented by the following structural formula (1):

[Structural formula (1)]

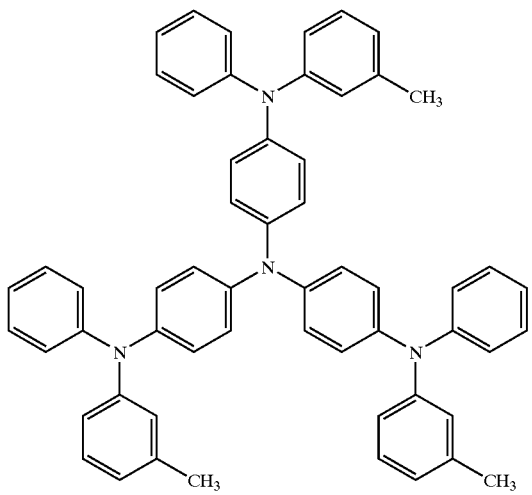

The MTDATA molecule is represented by a simplified chemical formula $C_{57}H_{48}N_4$ and its molar mass is 789.04 g/mol.

In the present example, the hole injecting and transporting layer 3 was formed to a thickness of 35 nm. Its thickness is generally within the range of 5 nm–160 nm, preferably within the range of 25 nm–70 nm.

In forming the hole injecting and transporting layer 3, MTDATA was vapor deposited on a substrate at a rate of 0.10 nm·$s^{-1}$. However, such a rate can be altered within the range from 0.0004 to 2.0 nm·$s^{-1}$. A substrate temperature used to vapor deposit a constituent material of the hole injecting and transporting layer 3 can be altered within the range of not exceeding 200° C., but is preferably maintained not to exceed a glass transition temperature of the material used. In the case where such a material is MTDATA, it is particularly preferred that a substrate temperature be maintained within the range of not exceeding 100° C.

The luminescent layer 4 was formed from a mixture containing, as a principal component (so-called "host"), N, N'-diphenyl-N, N'-(3-methylphenyl)-1,1'-biphenyl-4, 4'-diamine (generally called "TPD") which is a derivative of aromatic amine and represented by the following structural formula (2), and as a fluorescent dopant, 5, 6, 11, 12-tetraphynylnaphthacene (generally called "rubrene") which is aromatic hydrocarbon compound represented by the following structural formula (3):

[Structural formula (2)]

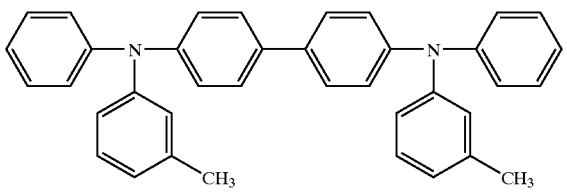

[structural formula (3)]

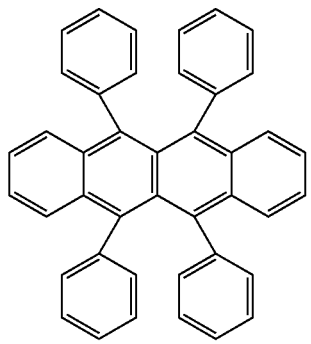

The dopant content was 5% by mass. The dopant content is generally in the range of 0.01–35% by mass, preferably in the range of 1.0–12% by mass, more preferably in the range of 2.5–7.5% by mass. The luminescent layer 4 was formed to a thickness of 16 nm. It is generally in the range of 5–120 nm, preferably in the range of 11–55 nm.

The principal component of the luminescent layer 4, i.e., the TPD molecule is represented by a simplified chemical formula $C_{38}H_{32}N_2$ and its molar mass is 516.685 g/mol. The fluorescent dopant present in the luminescent layer 4, i.e., the rubrene molecule is represented by a simplified chemical formula $C_{42}H_{28}$ and its molar mass is 532.68 g/mol. In the present Example, a ratio in molar mass of the dopant to host in the luminescent layer 4, i.e., rubrene to TPD (dopant/host), was accordingly determined to be 1.0310. A difference in molar mass between the dopant and host was only about 3.1%.

Each molecule to be deposited by a vacuum vapor deposition technique can travel a distance according to its mean free path determined on the basis of a physical principle from a temperature of its evaporation source and its molar mass. It is accordingly understood that the behavior of each molecule in a vacuum, i.e., in a vapor phase, is substantially governed by its molar mass. In this Example, the dopant and host molecules are about equal in molar mass, and accordingly behave similarly in a vapor phase, reach a substrate while forming a nearly perfectly mixed molecular beam in the vapor phase, and change to a solid phase. This enables formation of the luminescent layer 4 in which the dopant and host molecules are mixed in an ideal fashion.

On the other hand, if there exists a large difference in molar mass between dopant and host molecules, the one molecule having a lower molar mass, either dopant or host, travels at a relatively higher linear speed, compared to the other molecule. It is microscopically viewed that these two types of molecules form molecular beams distinct from each other and, after being changed into solids on the substrate, tend to result in independently localized concentrations. It is therefore understood that the dopant and host, if their molar masses differ greatly from each other, will fail to produce the luminescent layer 4 in which they are mixed in an ideal manner.

In the formation of the luminescent layer 4 on the substrate, an overall deposition rate of TPD and rubrene was set at 0.10 nm·s$^{-1}$. This rate can be altered within the range of 0.0004–2.0 nm·s$^{-1}$. While possible to be altered within the range of not exceeding 200° C., a substrate temperature is preferably controlled not to exceed any of the glass transition temperatures of materials used to form the hole injecting and transporting layer 3 or the luminescent layer 4. In the case where TPD is used, it is particularly preferred that a substrate temperature be controlled within the range of not exceeding 80° C.

The electron injecting and transporting layer 5 was formed from bis(10-hyroxybenzo[h]quinolinate)beryllium (generally called "Bebq") as represented by the following structural formula (4):

[Structural formula (4)]

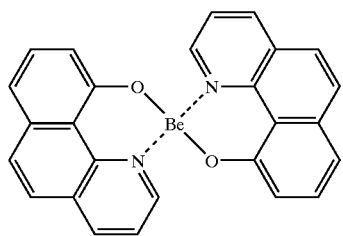

The electron injecting and transporting layer 5 was formed to a thickness of 38 nm. It is generally in the range of 5 nm–160 nm, preferably in the range of 25 nm–70 nm. The Bebq molecule is also represented by a simplified chemical formula $C_{26}H_{16}N_2O_2Be$ and its molar mass is 397.44 g/mol.

In the formation of the electron injecting and transporting layer 5 on the substrate, a deposition rate of Bebq was set at 0.10 nm·s$^{-1}$. This rate can be altered within the range of 0.0004–2.0 nm·s$^{-1}$. While possible to be altered within the range of not exceeding 200° C., a substrate temperature is preferably controlled not to exceed any of the glass transition temperatures of materials used to form the hole injecting and transporting layer 3, the luminescent layer 4 or the electron injecting and transporting layer 5. Where TPD is used, it is particularly preferred that a substrate temperature be maintained within the range of not exceeding 80° C.

Formation of a Negative Electrode

After the organic EL layer 8 consisting of the hole injecting and transporting layer 3, luminescent layer 4 and electron injecting and transporting layer 5 has been formed on the substrate, a negative electrode 6 is formed. The negative electrode 6 is formed to such a predetermined pattern as to intersect the patterned transparent positive electrode by vapor depositing constituent materials under vacuum with the aid of a shadow mask made of stainless steel.

In the formation of the negative electrode 6, such constituent materials are vapor deposited at a surrounding pressure reduced to about 0.1 mPa at a substrate temperature of 25° C. The negative electrode 6 was formed to a thickness of 300 nm. A thickness of the negative electrode 6 is generally in the range of 50 nm–500 nm.

Ce, as the "f" element having an electronegativity value higher than that of calcium, and, equal to or lower than that of vanadium, Al, as the "p" element having an electronegativity value equal to or higher than that of aluminum, lower than that of carbon, and lower than that of iodine, and Ni, as the "f" element having an electronegativity value equal to or higher than any of those of iron, cobalt and nickel, and, equal to or lower than that of gold, were vapor codeposited, while controlling a rate of evaporation of each element from its evaporation source by using a quartz oscillator-type film thickness monitoring equipment, to form an alloy-like compound or mixture which contained, by mass, 1.0% Ce, 95% Al and 4.0% Ni. The negative electrode was formed from this alloy-like compound or mixture. The unit "% by mass", as used herein, is a percentage representing each element content calculated on the basis of mass.

Ce, Al and Ni have the following electronegativity values; Ce (1.1–1.2: the first decimal place value was undecided because of its inclusion of errors in measurement), Al (1.5) and Ni (1.8).

Each element has the following atomic weight; Ce (140.115 g/mol), Al (26.981539 g/mol) and Ni (58.6934 g/mol).

Conversion of the aforementioned proportion in mass of Ce, Ni and Al to the proportion in the number of atoms of Ce, Ni and Al gives {(1 mass %/(140.115 g/mol)}:{4 mass %/(58.6934 g/mol)}:{95 mass %/(26.981539 g/mol)}, i.e., (0.198 atomic %):(1.90 atomic %):(97.9 atomic %). The unit "atomic %", as used herein, is a percentage representing each element content calculated on the basis of the number of atoms.

The calculation of a mean electronegativity value $E_{ave}$ from weighting an electronegativity value of each element by the above-given proportion in number of its atoms present in the aforementioned negative electrode 6 resulted in obtaining $E_{ave}$=1.50, assuming that an electronegativity value of Ce is 1.15.

The "f" element content, i.e., the Ce content by mass can be altered within the range of 0.001%–35%, preferably within the range of 0.1%–10%, more preferably within the range of 0.3%–3%. The "d" element content, i.e., the Ni content by mass can be altered within the range of 0%–99.9%, preferably within the range of 0.1%–50%, more preferably within the range of 1%–15%. It is preferred that a ratio (d/f) by mass of the element "d" to the element "f" contained in the mixture is not below 2.

In the formation of the negative electrode 6 on the substrate, deposition of each element was set at the following rate; Ce (3.0 ng·cm$^{-2}$·s$^{-1}$), Al (285 ng·cm$^{-2}$·s$^{-1}$) and Ni (12.0 ng·cm$^{-2}$·s$^{-1}$). For the evaporation sources of Al and Ni, their respective simple substances, i.e., pure metals were used. On the other hand, an Al alloy containing 5% by mass of Ce was used as the evaporation source of Ce. The deposition rate of Al onto the substrate can be altered generally within the range of 1.0–5,100 ng·cm$^{-2}$·s$^{-1}$, preferably within the range of 60–1,100 ng·cm$^{-2}$·s$^{-1}$. The deposition rates of the other elements can be determined based on their desired contents by mass in the resulting mixture.

A simple substance of each element has the following density at room temperature; Ce (6.8 g/cm$^3$), Al (2.69 g/cm$^3$) and Ni (8.85 g/cm$^3$). Accordingly, the negative electrode 6 is assumed to have a density of about 2.8 g/cm$^3$.

In the present Example, the negative electrode 6 was formed using a vacuum vapor deposition technique. However, other techniques, such as a sputtering technique, can also be employed. For example, the negative electrode may be sputter formed by using, as a target, a compound and/or mixture containing the "f" and "p" elements, or, a compound and/or mixture containing the "f", "p" and "d" elements.

Formation of a Protective Film

The protective film 7 was formed from silicon monoxide (SiO) to a thickness of 200 nm. Its thickness is generally not below 20 nm, preferably in the range of 80 nm–500 nm, and can be altered depending upon the typ of material used. The protective film 7 was applied by using a vacuum vapor deposition technique. A source material to form the protective film 7 was vapor deposited on the substrate at a rate of 0.5 nm·s$^{-1}$. This deposition rate can be altered within the range of 0.002–10 nm·s$^{-1}$. The source material is preferably electrically insulative. The provision of this protective film 7 is purposed to suppress modification of the negative electrode 6 or organic EL layer 8 as by moisture or oxygen. It should be recognized, however, that the protective film 7 is not necessarily incorporated in the organic EL device of the present invention.

Evaluation of Performance Characteristics of the Organic EL Device

The organic EL device, as fabricated in the manner as described above, was observed to emit yellow light when an DC voltage of 5.0 V was applied thereto. Conceivably, this yellow radiation was emitted when rubrene was relaxed from its excited state. The emissive luminance $L_{5V}$ achieved 500 cd/m$^2$, and the emission efficiencies were 10.9 cd/A and 6.9 lm/w.

Also, the emission efficiencies were 11.7 cd/A and 10.1 lm/w when the emissive luminance dropped to 100 cd/m$^2$.

The device was placed in the dry air having a 20% or lower relative humidity and operated by an DC constant current such that a current density was maintained constant at 46 A/m$^2$. An initial luminance was 500 cd/m$^2$. After the lapse of 100 hours, the luminance dropped to 400 cd/m$^2$. Accordingly, a luminance ratio $R_{100h}$, a ratio of the initial luminance to the luminance after the lapse of 100 hours, was stopped at 80%.

After the lapse of 500 hours, the luminance dropped to 350 cd/m$^2$. Accordingly, a luminance ratio $R_{500h}$, a ratio of the initial luminance to the luminance after the lapse of 500 hours, was stopped at 70%. No appreciable dark spot was observed.

Also, the device was left in the air having a relative humidity of 55–65% and a temperature of 20–30° C. for 500 hours and then driven to emit light. No appreciable dark spot was observed. The device exhibited uniform light emission.

EXAMPLES 2–32

The procedure of Example 1 was followed, except that mixtures and/or compounds containing different types and amounts of "f", "p" and "d" elements as listed in Tables 1 through 5 were used for negative electrodes, to fabricate organic EL devices.

For each organic EL device, the emissive luminance $L_{5V}$ was measured when the applied DC voltage was 5 V. Each device was also placed in the dry air having a 20% or lower relative humidity and operated by an DC constant current such that a current density was kept constant. The initial luminance was 500 cd/m$^2$. This DC constant current operation was continued and the emissive luminance $L_{500h}$ after the lapse of 500 hours was measured. A luminance ratio $R_{500h}$, a ratio of the initial luminance to the luminance after the lapse of 500 hours, was calculated based on the measured $L_{500h}$ value.

In Tables 1 through 5, the mean electronegativity value $E_{ave}$, emissive luminance $L_{5V}$ and luminance ratio $R_{500h}$, as measured and calculated for each device, are given.

In Example 30, a mixture and/or compound excluding the "d" element but containing 1.0% by mass of Ce, as the "f" element, and 99.0% by mass of Sb, as the "p" element, was used for a negative electrode. Likewise, Example 31 used a mixture and/or compound having a composition excluding the "d" element for a negative electrode.

TABLE 1

| Example No. | COMPOSITION, CONTENT (MASS %) [ATOMIC %] | | | $E_{ave}$ | $L_{5V}$ (cd/m$^2$) | $R_{500h}$ (%) |
|---|---|---|---|---|---|---|
| | f | p | d | | | |
| | Ce | Al | Ni | | | |
| 1 | 1.0% [0.20%] | 95.0% [97.9%] | 4.0% [1.90%] | 1.50 | 500 | 70 |
| 2 | 0.30% [0.06%] | 98.7% [99.5%] | 1.0% [0.46%] | 1.50 | 320 | 68 |
| 3 | 3.0% [0.62%] | 88.0% [94.9%] | 9.0% [4.46%] | 1.51 | 520 | 63 |
| 4 | 6.0% [1.32%] | 79.0% [90.8%] | 15.0% [7.92%] | 1.52 | 540 | 31 |
| 5 | 9.0% [2.09%] | 73.0% [87.9%] | 18.0% [9.97%] | 1.52 | 430 | 11 |
| 6 | 1.0% [0.19%] | 98.9% [99.8%] | 0.10% [0.05%] | 1.50 | 470 | 6 |
| 7 | 1.0% [0.27%] | 49.0% [67.9%] | 50.0% [31.8%] | 1.59 | 360 | 58 |

TABLE 2

| Example No. | COMPOSITION, CONTENT (MASS %) [ATOMIC %] | | | $E_{ave}$ | $L_{5V}$ (cd/m$^2$) | $R_{500h}$ (%) |
|---|---|---|---|---|---|---|
| | f | p | d | | | |
| | Ce | Al | Co | | | |
| 8 | 1.0% [0.20%] | 95.0% [97.9%] | 4.0% [1.89%] | 1.50 | 480 | 68 |
| | Ce | Al | Cu | | | |
| 9 | 1.0% [0.20%] | 95.0% [98.0%] | 4.0% [1.75%] | 1.51 | 470 | 63 |
| | Ce | Al | Ag | | | |
| 10 | 1.0% [0.20%] | 95.0% [98.8%] | 4.0% [1.04%] | 1.50 | 490 | 70 |
| | Ce | Sb | Co | | | |
| 11 | 1.0% [0.83%] | 94.0% [89.4%] | 5.0% [9.82%] | 1.88 | 270 | 36 |
| | Ce | Sb | Cu | | | |
| 12 | 1.0% [0.46%] | 1.0% [0.53%] | 98.0% [99.0%] | 1.90 | 250 | 38 |
| | Ce | Sb | Au | | | |
| 13 | 1.0% [0.87%] | 98.0% [98.5%] | 1.0% [0.62%] | 1.90 | 280 | 22 |
| | Ce | Sb | Pd | | | |
| 14 | 1.0% [0.87%] | 95.0% [94.6%] | 4.0% [4.56%] | 1.91 | 290 | 33 |

TABLE 3

| Example No. | COMPOSITION, CONTENT (MASS %) [ATOMIC %] | | | $E_{ave}$ | $L_5$ v (cd/m$^2$) | $R_{500 h}$ (%) |
|---|---|---|---|---|---|---|
| | f | p | d | | | |
| | Ce | Si | Ag | | | |
| 15 | 0.50% [0.38%] | 0.40% [1.52%] | 99.1% [98.1%] | 1.90 | 280 | 41 |
| | Ce | Ge | Ag | | | |
| 16 | 0.50% [0.38%] | 0.40% [0.59%] | 99.1% [99.0%] | 1.90 | 270 | 38 |
| | Ce | C | Co | | | |
| 17 | 0.50% [0.21%] | 0.10% [0.49%] | 99.4% [99.3%] | 1.80 | 310 | 48 |
| | Ce | N | Ni | | | |
| 18 | 0.50% [0.21%] | 0.10% [0.42%] | 99.4% [99.4%] | 1.80 | 290 | 43 |
| | Ce | S | Ni | | | |
| 19 | 1.50% [0.21%] | 0.20% [0.37%] | 99.3% [99.4%] | 1.80 | 280 | 32 |
| | Ce | O | Ni | | | |
| 20 | 0.50% [0.21%] | 0.20% [0.73%] | 99.3% [99.1%] | 1.81 | 260 | 26 |
| | Ce | Se | Ni | | | |
| 21 | 0.50% [0.21%] | 0.20% [0.15%] | 99.3% [99.6%] | 1.80 | 270 | 29 |

TABLE 4

| Example No. | COMPOSITION, CONTENT (MASS %) [ATOMIC %] | | | $E_{ave}$ | $L_5$ v (cd/m$^2$) | $R_{500 h}$ (%) |
|---|---|---|---|---|---|---|
| | f | p | d | | | |
| | Ce | Te | Ni | | | |
| 22 | 0.50% [0.21%] | 0.20% [0.09%] | 99.3% [99.7%] | 1.80 | 260 | 28 |
| | Be | Al | Ni | | | |
| 23 | 1.0% [3.00%] | 95.0% [95.2%] | 4.0% [1.84%] | 1.51 | 380 | 62 |
| | Sc | Al | Ni | | | |
| 24 | 1.0% [0.62%] | 95.0% [97.5%] | 4.0% [1.89%] | 1.50 | 390 | 65 |
| | Y | Al | Ni | | | |
| 25 | 1.0% [0.31%] | 95.0% [97.8%] | 4.0% [1.89%] | 1.50 | 410 | 66 |
| | Sm | Al | Ni | | | |
| 26 | 1.0% [0.18%] | 95.0% [97.9%] | 4.0% [1.90%] | 1.51 | 480 | 69 |
| | Eu | Al | Ni | | | |
| 27 | 1.0% [0.18%] | 95.0% [97.9%] | 4.0% [1.90%] | 1.51 | 470 | 68 |

TABLE 5

| Example No. | (mass %) [atomic %] | | | $E_{ave}$ | $L_5$ v (cd/m$^2$) | $R_{500 h}$ (%) |
|---|---|---|---|---|---|---|
| | f | p | d | | | |
| | Er | Al | Ni | | | |
| 28 | 0.30% [0.05%] | 98.7% [99.5%] | 1.0% [0.46%] | 1.50 | 310 | 61 |
| | Yb | Al | Ni | | | |
| 29 | 0.30% [0.05%] | 98.7% [99.5%] | 1.0% [0.46%] | 1.50 | 290 | 58 |
| | Ce | Sb | None | | | |
| 30 | 1.00% [0.87%] | 99.0% [99.1%] | None | 1.89 | 210 | 20 |
| | Ce | Al | None | | | |
| 31 | 3.00% [0.59%] | 97.0% [99.4%] | None | 1.50 | 480 | 3 |
| | Ce | B | Co | | | |
| 32 | 0.50% [0.21%] | 0.10% [0.54%] | 99.4% [99.2%] | 1.80 | 320 | 49 |

COMPARATIVE EXAMPLES 1–10

The procedure of Example 1 was followed, except that mixtures and/or compounds having different compositions (containing different combinations and amounts of the "a", "b" and "c" elements) as listed in Tables 6 and 7 were used as negative electrode materials, to fabricate comparative organic EL devices.

In the same manner as stated above, the comparative organic EL devices obtained were evaluated for performance characteristics. The results are given in the following Tables 6 and 7.

TABLE 6

| Example No. | COMPOSITION, CONTENT (MASS %) [ATOMIC %] | | | $E_{ave}$ | $L_5$ v (cd/m$^2$) | $R_{500 h}$ (%) |
|---|---|---|---|---|---|---|
| | a | b | c | | | |
| | Ce | | | | | |
| 1 | 100.0% [100.0%] | None | None | 1.15 | 0 | 0 |
| | Al | | | | | |
| 2 | 100.0% [100.0%] | None | None | 1.50 | 0 | 0 |
| | Ni | | | | | |
| 3 | 100.0% [100.0%] | None | None | 1.80 | 0 | 0 |
| | Ce | Ni | | | | |
| 4 | 1.0% [0.42%] | 99.0% [99.6%] | None | 1.80 | 90 | 9 |
| | Mg | | | | | |
| 5 | 100.0% [100.0%] | None | None | 1.20 | 0 | 0 |
| | Ag | | | | | |
| 6 | 100.0% [100.0%] | None | None | 1.90 | 0 | 0 |

TABLE 6-continued

| Example No. | COMPOSITION, CONTENT (MASS %) [ATOMIC %] | | | $E_{ave}$ | $L_{5V}$ (cd/m$^2$) | $R_{500h}$ (%) |
|---|---|---|---|---|---|---|
| | a | b | c | | | |
| | Mg | Ag | | | | |
| 7 | 69.2% [90.9%] | 30.8% [9.1%] | None | 1.26 | 190 | 8 |

TABLE 7

| Example No. | COMPOSITION, CONTENT (MASS %) [ATOMIC %] | | | $E_{ave}$ | $L_{5V}$ (cd/m$^2$) | $R_{500h}$ (%) |
|---|---|---|---|---|---|---|
| | a | b | c | | | |
| | Li | | | | | |
| 8 | 100.0% [100.0%] | None | None | 1.00 | 0 | 0 |
| | Li | Al | | | | |
| 9 | 0.50% [1.9%] | 99.5% [98.1%] | None | 1.49 | 240 | 0 |
| | Li | Mg | Ag | | | |
| 10 | 0.09% [0.4%] | 72.5% [91.8%] | 27.4% [7.8%] | 1.25 | 210 | 9 |

As apparent from the comparison of the results of Examples shown in Tables 1 through 5 to the results of Comparative Examples shown in Tables 6 and 7, the organic EL devices, in accordance with the present invention, exhibit the increased levels of emissive luminance and the reduced levels of luminance drop after long-term operation.

EXAMPLE 33

The procedure of Example 1 was followed, except that the luminescent layer 4 contained 5.0% by mass of naphthacene as a luminescent dopant, instead of rubrene, to fabricate an organic EL device. Like rubrene, naphthacene is an aromatic compound structurally represented as four benzene rings serially fused together. However, unlike rubrene, naphthacene contains no phenyl group. Naphthacene is represented by the following structural formula (5):

[Structural Formula (5)]

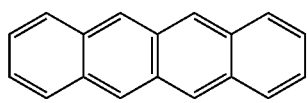

The above-fabricated organic EL device was observed to emit yellow light when an applied DC voltage was 5.0 V. Conceivably, this yellow radiation was emitted when naphthacene was relaxed from its excited state. The emissive luminance $L_{5V}$ achieved 327 cd/m$^2$, and the emission efficiencies were 7.1 cd/A and 4.8 lm/w. Also, the emission efficiencies were 7.3 cd/A and 5.2 lm/w when the emissive luminance was dropped to 100 cd/m$^2$.

The device was placed in the dry air having a 20% or lower relative humidity and operated by an DC constant current such that a current density was held constant. An initial luminance was 500 cd/m$^2$. After the lapse of 100 hours, the luminance dropped to 323 cd/m$^2$. Accordingly, a luminance ratio $R_{100h}$, a ratio of the initial luminance to the luminance after the lapse of 100 hours, was stopped at 64%. After the lapse of 500 hours, the luminance dropped to 251 cd/m$^2$. Accordingly, a luminance ratio $R_{500h}$, a ratio of the initial luminance to the luminance after the lapse of 500 hours, was stopped at 50%. No appreciable dark spot was observed. Also, the device was left in the air having a relative humidity of 55–65% and a temperature of 20–30° C. for 500 hours and then driven to emit light. No appreciable dark spot was observed. The device exhibited uniform light emission.

The fluorescent dopant present in the luminescent layer 4, i.e., the naphthacene molecule is represented by a simplified chemical formula $C_{18}H_{12}$ and its molar mass is 228.29 g/mol. It can be pointed out that in the present Example, a ratio in molar mass of the dopant to host in the luminescent layer 4, i.e., naphthacene to TPD (molar mass 516.685 g/mol) was 0.44184 and the molar mass of the host molecule was about 2.263 times greater than that of the dopant molecule.

EXAMPLE 34

The procedure of Example 1 was followed, except that the luminescent layer 4 contained 5.0% by mass of anthracene as a luminescent dopant, instead of rubrene, to fabricate an organic EL device. Anthracene is an aromatic compound structurally represented as three benzene rings serially fused together. However, anthracene contains no phenyl group, unlike rubrene. Anthracene is represented by the following structural formula (6):

[Structural Formula (6)]

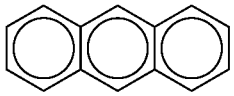

The above-fabricated organic EL device was observed to emit blue light when an DC voltage of 5.0 V was applied thereto. This blue radiation was conceivably emitted when anthracene was relaxed from its excited state. The emissive luminance $L_{5V}$ achieved 317 cd/m$^2$, and the emission efficiencies were 6.9 cd/A and 4.6 lm/w. Also, the emission efficiencies were 7.0 cd/A and 4.7 lm/w when the emissive luminance was dropped to 100 cd/m$^2$.

The device was placed in the dry air having a 20% or lower relative humidity and operated by an DC constant current such that a current density was held constant. An initial luminance was 500 cd/m$^2$. After the lapse of 100 hours, the luminance dropped to 192 cd/m$^2$. Accordingly, a luminance ratio $R_{100h}$, a ratio of the initial luminance to the luminance after the lapse of 100 hours, was stopped at 38%. After the lapse of 500 hours, the luminance dropped to 45 cd/m$^2$. Accordingly, a luminance ratio $R_{500h}$, a ratio of the initial luminance to the luminance after the lapse of 500 hours, was stopped at 9%. A number of appreciable dark spots were observed. Also, the device was left in the air having a relative humidity of 55–65% and a temperature of 20–30° C. for 500 hours and then driven to emit light. No appreciable dark spot was observed. The device exhibited uniform light emission.

The fluorescent dopant present in the luminescent layer 4, i.e., the anthracene molecule is represented by a simplified chemical formula $C_{14}H_{10}$ and its molar mass is 178.23 g/mol. It can be pointed out, accordingly, that in the present Example, a ratio in molar mass of the dopant to host in the luminescent layer 4, i.e., anthracene to TPD (molar mass= 516.685 g/mol) was 0.34495, and the molar mass of the host molecule was about 2.899 times greater than that of the dopant molecule.

As apparent from the results obtained in Examples 33 and 34, the organic EL device according to the present invention, even if the type of the fluorescent dopant in its luminescent layer is changed, exhibits the increased level of emissive luminance and the reduced level of luminance drop after long-term operation.

The organic EL layer was illustrated in the above Examples as having a structure consisting of the hole injecting and transporting layer, luminescent layer and electron injecting and transporting layer. However, the present invention is not limited to such a multilayer structure, and can be applied to the other types of multilayer structures. Also, the materials used in the above Examples, such as luminescent materials, dopant materials, hole transporting materials, electron transporting materials, positive electrode materials and other materials, are not intended to limit the present invention. Furthermore, other manufacturing processes can be used if applicable to the present invention.

EXAMPLE 35

Figure 2:
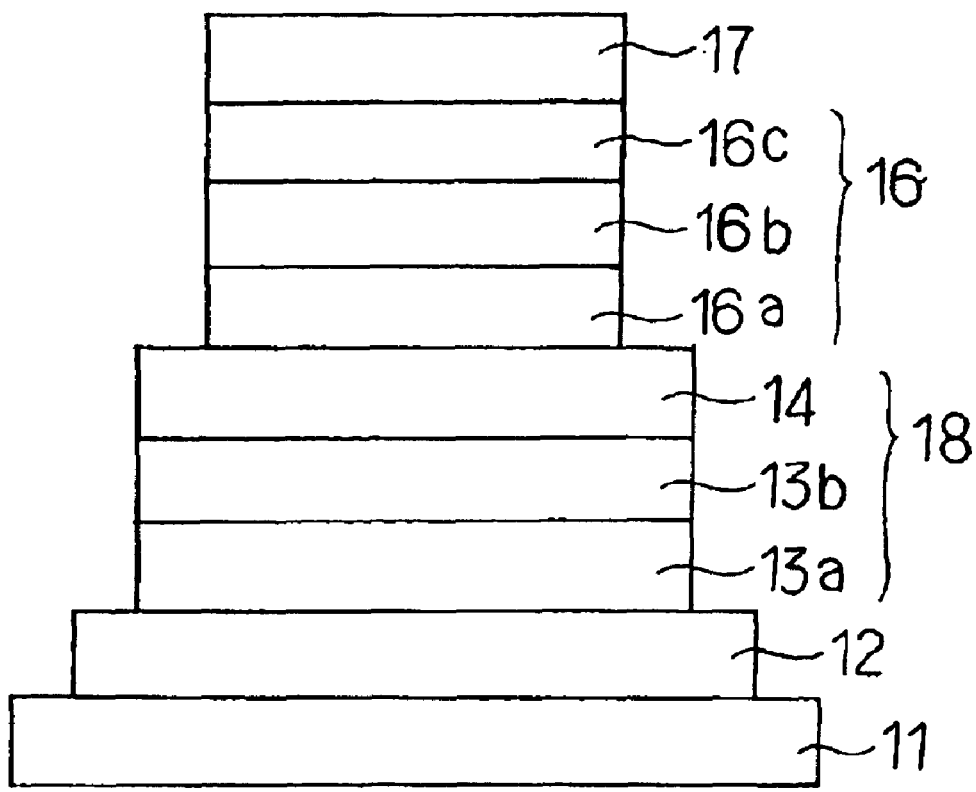
FIG. 2 is a sectional view, illustrating another embodiment of an organic EL device in accordance with the present invention.

FIG. 2 is a sectional view, showing a construction of an organic EL device of Example 35. Referring to FIG. 2, a glass substrate 11 is shown to carry a transparent positive electrode 12 thereon. In the fabrication of a display with light emitting elements arranged in a matrix pattern, a parallel set of strip-form transparent positive electrodes 12 may be pattern formed on the glass substrate 11. A sequence of a hole injecting layer 13a, a hole transporting layer 13b, a luminescent layer 14, each formed of organic material, overlies the transparent positive electrode 2. The hole injecting layer 13a, hole transporting layer 13b and luminescent layer 4 constitute an organic EL layer 18. Overlying the luminescent layer 14 is a negative electrode 16 which consists of a first layer 16a positioned on the luminescent layer 14, a second layer 16b on the first layer 16a and a third layer 16c on the second layer 16b. The negative electrode 16 is covered with a protective layer 17.

A manufacturing process of the organic EL device of the present embodiment will be now explained.

Fabrication of a Transparent Positive Electrode

In the similar manner as in Example 1, a parallel set of stip-form transparent electrodes 12 was pattern formed on the glass substrate 1. In this Example, the patterned transparent positive electrode 2 was formed from indium tin oxide (ITO) to an average thickness of 200 nm.

Formation of an Organic EL Layer

The hole injecting layer 13a, hole transporting layer 13b and luminescent layer 14 were sequentially stacked on the glass substrate 11 carrying the patterned transparent positive electrode 12 by a vacuum vapor deposition technique. The hole injecting layer 13a, hole transporting layer 13b and luminescent layer 14 were vapor deposited at a surrounding pressure reduced to about 0.1 mPa at a substrate temperature of 25° C.

The hole injecting layer 13a was formed from copper (II) phthalocyanine (generally called CuPc), as represented by the following structural formula (7):

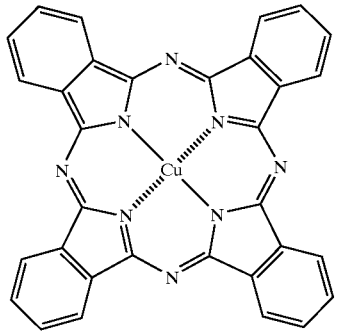

[Structural formula (7)]

In the present Example, the hole injecting layer 13a was formed to a thickness of 10 nm. The CuPc molecule is represented by a simplified chemical formula $C_{32}H_{16}N_8Cu$ and its molar mass is 576.08 g/mol.

The hole transporting layer 13b was formed from N,N'-di-1-naphthalenyl-N,N'-diphenyl-(1,1'-biphenyl)-4,4-diamine (generally called "NPB"), as represented by the following structural formula (8):

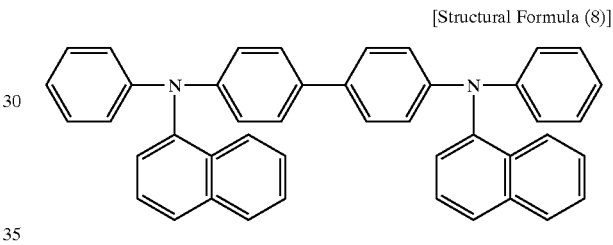

[Structural Formula (8)]

In the present Example, the hole transporting layer 13b was formed to a thickness of 80 nm. The NPB molecule is represented by a simplified chemical formula $C_{44}H_{32}N_2$ and its molar mass is 588.0 g/mol.

The luminescent layer 14 was formed from aluminum tris(quinoline-8-olate) (generally called "Alq$_3$") as represented by the following structural formula (9):

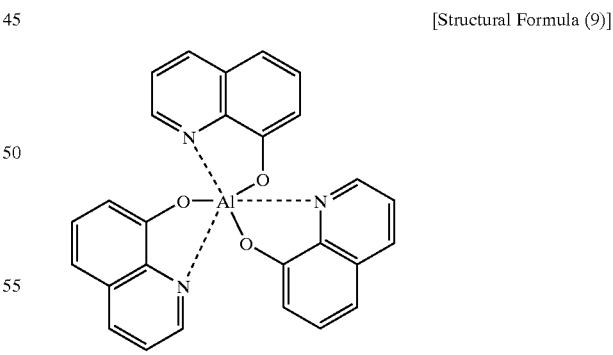

[Structural Formula (9)]

In the present Example, the luminescent layer 14 was formed to a thickness of 40 nm. The Alq$_3$ molecule is represented by a simplified chemical formula $C_{27}H_{18}N_3O_3Al$ and its molar mass is 459.44 g/mol.

Formation of a Negative Electrode

After formation on the glass substrate 11 of the organic EL layer 18 consisting of the hole injecting layer 13a, hole transporting layer 13b and luminescent layer 14, a negative electrode 16 are formed. The negative electrode 16 is formed in such a predetermined pattern as to intersect the patterned transparent positive electrode 12 by vapor depositing constituent materials under vacuum with the aid of a shadow mask made of stainless steel. The negative electrode 16 is formed by stacking on the luminescent layer 14, in sequence, the first negative electrode layer 16a, second negative electrode layer 16b and third negative electrode layer 16c.

The first negative electrode layer 16a was substantially formed from Ce as the "f" element. The first negative electrode layer 16a was vapor deposited at a surrounding pressure reduced to about 0.1 mPa at a substrate temperature of 25° C. In this Example, the first negative electrode layer 16a was formed to a thickness of 1 nm. A thickness of the first negative electrode layer 16a is preferably up to 5 nm, more preferably in the range of 0.1–5 nm. Ce is the most abundant element, among rare-earth elements, and is present in the concentration of 46 ppm in the earth crust. Ce is thus considered to have the least potential of depletion among the rare-earth elements. Ce has an atomic weight of 140.12 g/mol which is not too high but is close in level to Ba (atomic weight=137.323 g/mol), one of alkaline earth metals. This preferred atomic weight level makes Ce suitable for use in the formation of high-quality thin-film negative electrodes by a sputtering or vacuum vapor deposition technique. According to a literature, a vapor pressure of Ce is 0.1333 Pa at 1,572° C., 1.333 Pa at 1,737° C. and 13.33 Pa at 1,947° C. In the formation of negative electrodes by a vacuum vapor deposition technique, this relatively high level in vapor pressure of Ce permits deposition at temperatures of not exceeding 2,000° C. Also, because of its low electronegativity value, the inclusion of Ce in the negative electrode facilitates electron injection into the organic EL layer 18. For the reasons as stated above, the present Example used Ce for the first negative electrode layer 16a.

The second negative electrode layer 16b has such a composition gradient in its thickness direction that toward its interface with the third negative electrode layer 16c from its interface with the first negative electrode layer 16a, its Off element content, i.e., Ce content decreases while its "p" element content, i.e., Al content increases. The second negative electrode layer 16b contained 100% by mass of Ce at its interface with the first negative electrode layer 16a, and 7.5% by mass of Ce and 92.5% by mass of Al in the vicinity of its interface with the third negative electrode layer 16c. Specifically, Ce and Al were vapor codeposited at a surrounding pressure reduced to about 0.1 mPa at a substrate temperature of 25° C., while controlling a rate of evaporation of each element from its evaporation source by using a quartz oscillator-type film thickness monitoring equipment, to form the second negative electrode layer 13b having such a predetermined composition gradient in its thickness direction. In the present Example, the second negative electrode layer 16b was formed to a thickness of 20 nm. A thickness of the second negative electrode layer 16b is generally in the range of 1–40 nm.

The third negative electrode layer 16c is substantially formed from Al as the "p" element. The third negative electrode layer 16c is vapor deposited at a surrounding pressure reduced to about 0.1 mPa at a substrate temperature of 25° C. In this Example, the third negative electrode layer 16c was formed to a thickness of 300 nm. A thickness of the third negative electrode layer 16c is generally in the range of 50–400 nm. Al, constituting the third negative electrode layer 16c, has an electrical resistivity of 2.655 $\mu\Omega$cm, and is more electrically conductive compared to Ce (electrical resistivity=75.0 $\mu\Omega$cm). The increased thickness of the third negative electrode layer 16c thus serves to reduce the overall electrical resistance of the negative electrode 16.

In this Example, the second negative electrode layer 16b having the aforementioned graded composition is interposed between the first negative electrode layer 16a substantially formed of Ce and the third negative electrode layer 16c substantially formed of Al. This construction assures good adhesion between the first and second negative electrode layers 16a and 16b and also between the second and third negative electrode layers 16b and 16c, leading to the reduced occurrence of delamination and to the relaxation of heat shock due to the difference in thermal expansibility between Ce and Al.

In this Example, the first negative electrode layer 16a is substantially formed from Ce, as the "f" element, the third negative electrode layer 16c from Al, as the "p" element, and the second negative electrode layer 16b from the aforementioned "f" and "p" elements, i.e., Ce and Al, such that it has a composition gradient in its thickness direction. However, the present invention is not limited to such a construction. An additional element may further be included in at least one of the first, second and third negative electrode layers 16a, 16b and 16c.

The additional element may preferably be at least one element, "d", selected from those having electronegativity values equal to or higher than any of those of iron, cobalt and nickel, and, equal to or lower than that of gold. However, the selection in type of such an additional element may be suitably made depending upon the particular purpose contemplated.

The following illustrates a possible negative electrode construction incorporating such an additional element.

The first negative electrode layer 16a is formed substantially from Yb, as the "f" element, and Zn, as the second "p" element, such that it contains, on average, 50% by mass of Yb and 50% by mass of Zn. The second negative electrode layer 16b is formed substantially from Yb, as the "f" element, Zn, as the second "p" element, and Al, as the first "p" element, such that the second negative electrode layer 16b defines a composition gradient in its thickness direction, specifically, contains, on average, 50% by mass of Yb, 50% by mass of Zn and 0% by mass of Al at its interface with the first negative electrode layer 12a, and 0% by mass of Yb, 0% by mass of Zn and 100% by mass of Al in the vicinity of its interface with the third negative electrode layer 16c. The third negative electrode layer 16c is formed substantially solely from Al, as the first "p" element.

Formation of a Protective Film

Analogous to Example 1, a protective film 17 was formed from silicon monoxide (SiO) to a thickness of 300 nm.

COMPARATIVE EXAMPLE 11

The procedure of Example 35 was followed, except that the negative electrode 16 was constructed in a single layer (300 nm thick) of an Mg-In alloy (containing 90% by mass of Mg and 10% by mass of In), to form a comparative organic EL device.

Evaluation of Performance Characteristics of the Organic EL Devices

The organic EL devices of Example 35 and Comparative Example 11, as respectively fabricated in the manners as stated above, were measured for initial luminance and initial emission efficiency when an applied DC voltage was 14 V. The measurement results are given in the following Table 8.

TABLE 8

|  | INITIAL LUMINANCE at 14 V | INITIAL EMISSION EFFICIENCY at 14 V | |
|---|---|---|---|
|  | (cd/m$^2$) | (cd/A) | (lm/w) |
| Example 35 | 7.0 × 10$^3$ | 2.50 | 0.56 |
| Comp. Example 11 | 1.4 × 10$^4$ | 0.91 | 0.20 |

As can be seen from Table 8, the organic EL device of Example 35 according to the present invention exhibited the increased initial efficiency of light emission, compared to the organic EL device of Comparative Example 11.

Also, each device was placed in the dry air having a 20% or lower relative humidity and operated by an DC constant current such that an operating current density was held constant at 100 A/m$^2$, and measured for luminance, emission efficiency and chromaticity, both initially and after the lapse of 500 hours. The measurement results are given in the following Table 9.

TABLE 9

| | LAPSE OF TIME | VOLTAGE | LUMINANCE | EMISSION EFFICIENCY | | CHROMATICITY | |
|---|---|---|---|---|---|---|---|
| | (h) | (V) | (cd/m$^2$) | (cd/A) | (lm/w) | CIE-x | CIE-y |
| Example 35 | 0 | 9.3 | 120 | 1.20 | 0.41 | 0.29 | 0.59 |
| | 500 | 12.4 | 78 | 0.78 | 0.20 | 0.29 | 0.59 |
| Comp. Example 11 | 0 | 9.5 | 107 | 1.07 | 0.35 | 0.31 | 0.58 |
| | 500 | 13.9 | 51 | 0.51 | 0.12 | 0.32 | 0.59 |

As can be appreciated from Table 9, the organic EL device of Example 35 according to the present invention exhibited higher levels of luminance and emission efficiency, both initially and after 500 hours, compared to the organic EL device of Comparative Example 11, and showed little change in chromaticity.

The organic EL layer of Example 35 was illustrated as having a structure consisting of the hole injecting layer, hole transporting layer and luminescent layer. However, the present invention is not limited to such a multilayer structure, and can be applied to the other configurations of multilayer structures. Also, the materials used in Example 35, such as luminescent materials, hole injecting materials, hole transporting materials, electrode materials and other materials, are not intended to limit the present invention. Also, other manufacturing processes can alternatively be employed if applicable to the present invention.

In accordance with the organic EL device of the present invention, an improvement in emission efficiency can be achieved. Also, a voltage level required to obtain a desired emissive luminance can be lowered. This leads to the reduction in level of an operating voltage. Also, the increased emissive luminance can be obtained when a given voltage is applied.

Furthermore, a phenomena observed when light emission is continued at a given current density, i.e., the reduction of emissive luminance with the lapse of time, can be suppressed to occur for at least a certain period of time. The emissive luminance that is obtained under the operation at a given current density and/or at a given voltage applied can thus be maintained at a level of not below a certain value over a long period of time. Therefore, a service life of the device can be extended.

What is claimed is:

1. An organic electroluminescent device having a luminescent material containing layer interposed between a positive electrode and a negative electrode for supplying electrical energy to said luminescent material for emitting light upon receipt of said electrical energy, said negative electrode containing f-, p-, and d-elements wherein:
   said f-element is at least one element selected from the group consisting of Be, Ti, V, Cr, Mn, Zr, Nb, La, Ce, Pr, Nd, Sm, Gd, Tb, Dy, Ho, Er, Tm, Lu, Hf and Ta;
   said p-element is Sb, and
   said d-element is at least one element selected from the group consisting of Cu, Ag, Au, and Al.

2. The organic electroluminescent device of claim 1, wherein said luminescent material containing layer comprises at least a host, as a principal component, and a fluorescent dopant, and wherein a molar mass ratio of a molecule of said dopant to a molecule of said host (dopant/host) is in the range of 0.344 to 2.90.

3. The organic electroluminescent device of claim 1, wherein said f-element is at least one element selected from the group consisting of La, Ce, Pr, Nd, Sm, Gd, Tb, Dy, Ho, Er, Tm, and Lu.

4. The organic electroluminescent device of claim 1, wherein said f-element is at least one element selected from the group consisting of La, Ce, Pr, Nd, Sm, Gd, Tb, Dy, Ho, and Er.

5. The organic electroluminescent device of claim 1, wherein said f-element is at least one element selected from the group consisting of La, Ce, and Pr.

6. The organic electroluminescent device of claim 1, wherein said f-element is at least one element selected from the group consisting of Ce, Pr, Nd, Gd, Tb, Dy, Ho, Er and Lu.

7. The organic electroluminescent device of claim 1, wherein said f-element is at least one element selected from the group consisting of Sm and TM.

8. The organic electroluminescent device of claim 1, Wherein said f-element is at least one element selected from the group consisting of Ce, Pr, Nd, Sm, Gd, Tb, Dy, Ho, Er, Tm and Lu.

9. The organic electroluminescent device of claim 1, wherein a mean electronegativity value $E_{ave}$ of said negative electrode is in the range of 1.50–1.91, relative to an electronegativity value of 1.15 of a lanthanoid element, wherein said mean electronegativity value is calculated by weighting an electronegativity value of each negative electrode constituting f- and p-element by a proportion of a number of atoms of the respective f- and p-element present in the negative electrode.

10. The organic electroluminescent device of claim 9, wherein said lanthanoid element is Ce.

11. The organic electroluminescent device of claim 1, wherein said device has an emission efficiency of at least 10.0 cd/A when said device is operated by a flow of a DC current to emit light with a controlled luminance of 100 cd/m$^2$, said emission efficiency being calculated by dividing said luminance by a current density.

12. An organic electroluminescent device having a luminescent material-containing layer interposed between a positive electrode and a negative electrode for supplying an electrical energy to said luminescent material for emitting light upon receipt of said electrical energy, said negative electrode containing f- and p- elements wherein:

said f-element is at least one element selected from the group consisting of La, Ce, Eu and Yb; wherein said p-element is at least one element selected from the group consisting of Zn, Al, Sn and Sb, and wherein said negative electrode comprises a first layer closest to said luminescent material-containing layer, a second layer overlying said fist layer and a third layer overlying said second layer, and wherein said first layer is made of at least one of said f-element, wherein said second layer is made of a mixture or compound of at least one each of said f- and p-elements and said third layer is made of at least one of said p-element.

13. The organic electroluminescent device of claim 12, wherein said f-element is Ce and said p-element is Al.

14. The organic electroluminescent device of claim 12, wherein said second layer has such a composition gradient in its thickness direction toward its interface with the third layer from its interface with the first layer, that a content of said f-element in said second layer decreases while a content of said p-element increases in said thickness direction of said second layer.

15. The organic electroluminescent device of claim 12, wherein at least one of said first, second and third layers of said negative electrode contain an additional element different from the constituent element thereof.

16. An organic electroluminescent device having a luminescent material-containing layer interposed between a positive electrode and a negative electrode for supplying an electrical energy to the luminescent material for emitting light upon receipt of said electrical energy, said negative electrode containing f- and p-elements wherein:

said f-element is at least one element selected from the group consisting of elements having electronegativity values higher than that of calcium and equal to or lower than that of vanadium; and said p-element is at least one element selected from the group consisting of elements having electronegativity values equal to or higher than that of aluminum; and wherein said negative electrode comprises a first layer closest to said luminescent material-containing layer, a second layer overlying said first layer and a third layer overlying said second layer, and wherein said first layer is made of at least one of said f-element, said second layer is made of a mixture or compound of at least one each of said f- and p-elements and said third layer is made of at least one of said p-element.

17. The organic electroluminescent device of claim 16, wherein said second layer has such a composition gradient in its thickness direction toward its interface with the third layer from its interface with the first layer, that a content of said f-element in said second layer decreases while a content of said p-element increases in said thickness direction of said second layer.

18. The organic electroluminescent device of claim 16, wherein at least one of said first, second and third layers of said negative electrode contain an additional element different from the constituent element thereof.

19. An organic electroluminescent device having a luminescent material containing layer interposed between a positive electrode and a negative electrode for supplying electrical energy to said luminescent material for emitting light upon receipt of said electrical energy, said negative electrode containing f-, p-, and d-elements wherein:

said f-element is at least one element selected from the group consisting of Be, Nb, Ce, Pr, Sm, Tb, Dy, Ho, Er, Tm, Lu, Hf and Ta;

said p-element is at least one element selected from the group consisting of H, B, C, N, O, F, Al, Si, P, S, Cl, Gs, As, Se, Br, Sb, Te, I, Tl, and Hg, and said d-element is at least one element selected from the group consisting of Re, Fe, Ru, Os, Co, Rh, Ir, Ni, Pd, Pt, Cu, Au, Hg, Tl, Si, Ge, P, As, Sb, Se and Te and wherein said d-element is excluded from the selection of said f- or p-element.

* * * * *

UNITED STATES PATENT AND TRADEMARK OFFICE
CERTIFICATE OF CORRECTION

PATENT NO. : 6,781,305 B1
DATED : August 24, 2004
INVENTOR(S) : Fujii

It is certified that error appears in the above-identified patent and that said Letters Patent is hereby corrected as shown below:

Column 2,
Line 12, after "calcium", replace "(Fauling" by -- (Pauling --;
Line 20, after "Sm", replace "(1.1-1,2)," by -- (1.1-1.2), --;
Line 28, before "(1.8,", replace "Ti" by -- Tl --;
Line 56, after "Rh", replace "(2.2>," by -- (2.2), --.

Column 4,
Line 19, after "bond", replace "radii,of" by -- radii of --.

Column 6,
Line 9, after "the", replace "Aft" by -- "f" --;
Line 14, before "simple", replace "hose" by -- whose --.

Column 7,
Line 5, after "below", replace "500 cd/m$^2_1$" by -- 500 cd/m$^2$, --;
Line 54, after "bond", replace "enegies" by -- energies --.

Column 8,
Line 5, after "chloride", replace "ioninc" by -- ionic --;
Line 32, after "element-intrisuisic", replace "preperties", by -- properties --;
Line 42, after "in", replace "paratheses" by -- parentheses --;
Line 55, before "metal", replace "alakline" by -- alkaline --;
Line 63, before "metals", replace "alkaline" by -- alkaline --.

Column 10,
Line 52, after "of", replace "stip-form" by -- strip-form --;
Line 60, after "and", replace "examples" by -- examples --.

Column 11,
Line 59, before "however,", replace "0.10 mm$^{-1}$." by -- 0.10 nm$\cdot$s$^{-1}$. --.

Column 14,
Line 31, after "gives", replace "{(1 mass" by -- {1 mass --;
Line 58, after "as", replace "the-evaporation" by -- the evaporation --.

Column 15,
Line 14, before "of", replace "typ" by -- type --.

UNITED STATES PATENT AND TRADEMARK OFFICE
CERTIFICATE OF CORRECTION

PATENT NO.   : 6,781,305 B1
DATED        : August 24, 2004
INVENTOR(S)  : Fujii

It is certified that error appears in the above-identified patent and that said Letters Patent is hereby corrected as shown below:

Column 21,
Line 49, before "transparent", replace "stip-form" by -- strip-form --.

Column 23,
Line 42, before "element", replace "Off" by -- "f" --.

Column 26,
Line 57, after "and", replace "TM." by -- Tm. --.

Column 27,
Line 24, after "said", replace "fist" by -- first --.

Column 28,
Line 38, after "Cl,", replace "Gs," by -- Ge, --.

Signed and Sealed this

Twenty-fifth Day of January, 2005

JON W. DUDAS
*Director of the United States Patent and Trademark Office*

UNITED STATES PATENT AND TRADEMARK OFFICE
CERTIFICATE OF CORRECTION

PATENT NO. : 6,781,305 B1
DATED : August 24, 2004
INVENTOR(S) : Fujii

It is certified that error appears in the above-identified patent and that said Letters Patent is hereby corrected as shown below:

Column 2,
Line 12, after "calcium", replace "(Fauling" by -- (Pauling --;
Line 20, after "Sm", replace "(1.1-1,2)," by -- (1.1-1.2), --;
Line 28, before "(1.8,", replace "Ti" by -- Tl --;
Line 56, after "Rh", replace "(2.2 > ," by -- (2.2), --.

Column 4,
Line 19, after "bond", replace "radii,of" by -- radii of --.

Column 6,
Line 9, after "the", replace "Aft" by -- "f" --;
Line 14, before "simple", replace "hose" by -- whose --.

Column 7,
Line 5, after "below", replace "500 cd/m$^2_1$," by -- 500 cd/m$^2$, --;
Line 54, after "bond", replace "enegies" by -- energies --.

Column 8,
Line 5, after "chloride", replace "ioninc" by -- ionic --;
Line 32, after "element-intrinsic", replace "preperties", by -- properties--;
Line 42, after "in", replace "paratheses" by -- parentheses --;
Line 55, before "metal", replace "alakline" by -- alkaline --;
Line 63, before "metals", replace "alkaline" by -- alkaline --.

Column 10,
Line 52, after "of", replace "stip-form" by -- strip-form --;
Line 60, after "and", replace "exmaples" by -- examples --.

Column 11,
Line 59, before "however,", replace "0.10 nm $^{-1}$." by -- 0.10 nm·s$^{-1}$. --.

Column 14,
Line 31, after "gives", replace "{(1 mass" by -- {1 mass --;
Line 58, after "as", replace "the-evaporation" by -- the evaporation --.

Column 15,
Line 14, before "of", replace "typ" by -- type --.

Column 21,
Line 49, before "transparent", replace "stip-form" by -- strip-form --.

UNITED STATES PATENT AND TRADEMARK OFFICE
CERTIFICATE OF CORRECTION

PATENT NO. : 6,781,305 B1
DATED : August 24, 2004
INVENTOR(S) : Fujii

It is certified that error appears in the above-identified patent and that said Letters Patent is hereby corrected as shown below:

Column 23,
Line 42, before "element", replace "Off" by -- "f" --.

Column 26,
Line 57, after "and", replace "TM." by -- Tm. --.

Column 27,
Line 24, after "said", replace "fist" by -- first --.

Column 28,
Line 38, after "Cl,", replace "Gs," by -- Ge, --.

Signed and Sealed this

Thirty-first Day of May, 2005

JON W. DUDAS
*Director of the United States Patent and Trademark Office*